US009196521B2

(12) United States Patent
Mohamed et al.

(10) Patent No.: US 9,196,521 B2
(45) Date of Patent: Nov. 24, 2015

(54) ADJUSTABLE PICK-UP HEAD AND METHOD FOR MANUFACTURING A DEVICE

(71) Applicant: Infineon Technologies AG, Neubiberg (DE)

(72) Inventors: Abdul Rahman Mohamed, Johor (MY); Subaramaniym Senivasan, Melaka (MY); Zakaria Abdullah, Seremban (MY); Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 245 days.

(21) Appl. No.: 13/669,339

(22) Filed: Nov. 5, 2012

(65) Prior Publication Data

US 2014/0123454 A1    May 8, 2014

(51) Int. Cl.
*H01L 21/683*    (2006.01)
*H01L 23/00*    (2006.01)

(52) U.S. Cl.
CPC ............ *H01L 21/6838* (2013.01); *H01L 24/75* (2013.01); *H01L 24/83* (2013.01); *H01L 2224/75702* (2013.01); *H01L 2224/75823* (2013.01); *H01L 2224/8382* (2013.01); *H01L 2224/8385* (2013.01); *H01L 2924/07802* (2013.01); *H01L 2924/1301* (2013.01); *H01L 2924/1305* (2013.01); *H01L 2924/13055* (2013.01); *H01L 2924/13091* (2013.01); *Y10T 29/49716* (2015.01); *Y10T 29/49826* (2015.01); *Y10T 29/53174* (2015.01)

(58) Field of Classification Search
CPC .............. B25B 2/00; B25B 5/122; B25B 1/00
USPC ............ 269/71, 3, 6, 75, 89; 254/133 R, 134
See application file for complete search history.

(56) References Cited

U.S. PATENT DOCUMENTS

| | | | |
|---|---|---|---|
| 3,223,442 A | 12/1965 | Fawdry et al. | |
| 3,711,142 A | 1/1973 | Wolski | |
| 4,491,306 A | 1/1985 | Eickhorst | |
| 5,092,572 A * | 3/1992 | Litwak et al. | 5/600 |
| 5,172,922 A | 12/1992 | Kowaleski et al. | |
| 5,590,870 A * | 1/1997 | Goellner | 269/21 |
| 5,957,445 A * | 9/1999 | Hagman et al. | 269/75 |
| 6,012,711 A * | 1/2000 | Cipolla | 269/21 |
| 7,398,735 B1 | 7/2008 | Sunderland | |
| 7,511,382 B2 | 3/2009 | Riedl et al. | |
| 8,037,918 B2 | 10/2011 | Wang et al. | |
| 8,181,948 B2 | 5/2012 | Blick et al. | |
| 8,246,025 B2 * | 8/2012 | Yamamura et al. | 269/45 |
| 8,267,367 B2 | 9/2012 | Cho | |
| 2003/0151184 A1* | 8/2003 | Wiebe | 269/75 |
| 2008/0054541 A1* | 3/2008 | Dixon et al. | 269/75 |

(Continued)

FOREIGN PATENT DOCUMENTS

DE    10 2004 021 633 B4    4/2006

*Primary Examiner* — Lee D Wilson
(74) *Attorney, Agent, or Firm* — Slater & Matsil, L.L.P.

(57) ABSTRACT

An adjustable pick-up head, a collet head, a method to adjust a pick-up head and a method of manufacturing a device are disclosed. In one embodiment a pick-up head includes a shank having a holder and an intermediate body connected to the holder by a first joint. The pick-up head further includes a collet head connected to the intermediate body by a second joint.

17 Claims, 10 Drawing Sheets

(56) References Cited

U.S. PATENT DOCUMENTS

| | | | |
|---|---|---|---|
| 2009/0184449 A1* | 7/2009 | Drees .......................... 269/71 |
| 2012/0060603 A1 | 3/2012 | Bork | |
| 2012/0083392 A1 | 4/2012 | Taranto | |
| 2014/0123454 A1* | 5/2014 | Mohamed et al. ........... 29/401.1 |

* cited by examiner

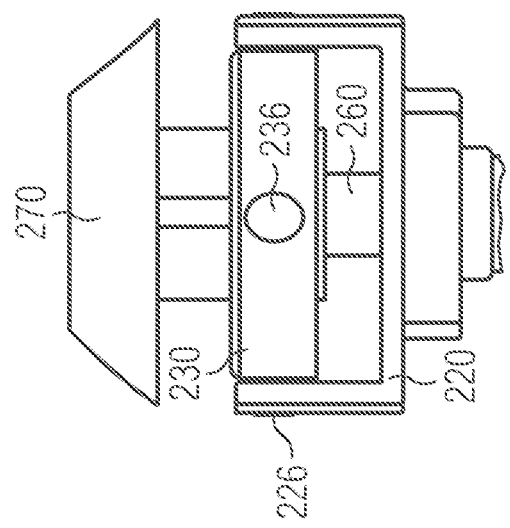
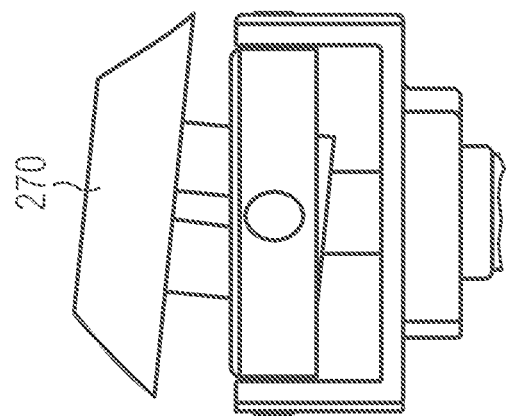
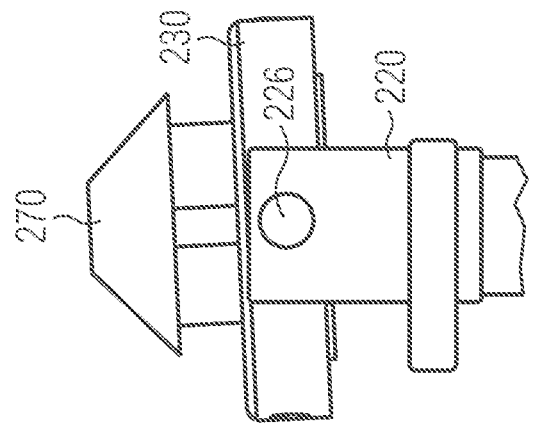

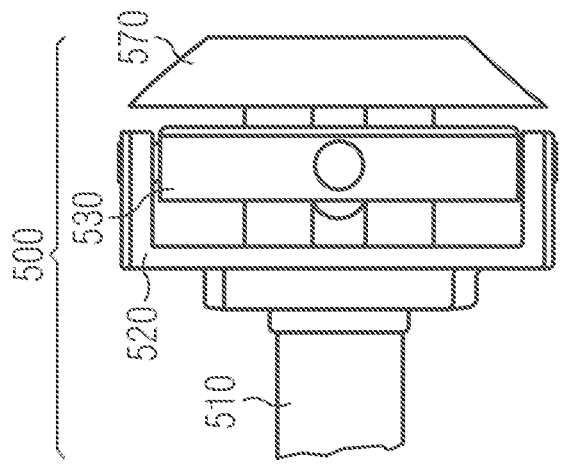
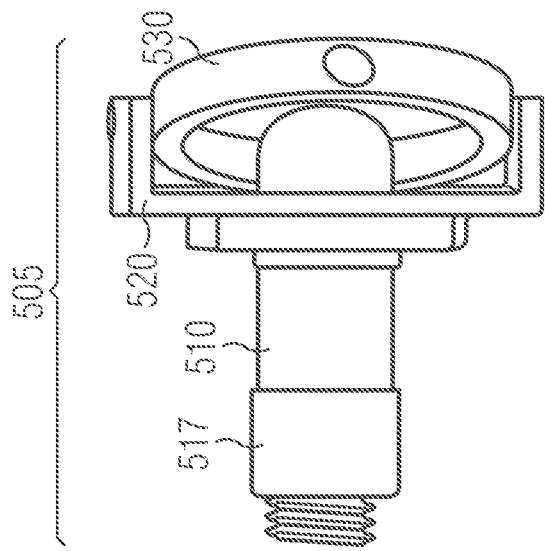

ADJUSTABLE PICK-UP HEAD AND METHOD FOR MANUFACTURING A DEVICE

TECHNICAL FIELD

The present invention relates generally to tools for fabricating micro-electronic devices, and in particular to a pick-up head of a die bonding system.

BACKGROUND

In cost-effective high volume manufacturing of semiconductor devices a plurality of components is generally built in or built on silicon wafers which after completion of FEOL processing are cut up into individual units, termed "dies" or "chips." During the subsequent stages of packaging and assembly incorporation of a die into a protective package or integration to more complex electronic systems may occur. Bonding the die to a carrier substrate may be established via a solder layer or an adhesive layer. Mounting a die at its assigned bonding location on the substrate requires high precision robotic systems. Typically, a die pick-up device picks up a die, moves the die accurately above the bonding site of the carrier, and places the die onto the carrier.

SUMMARY OF THE INVENTION

In accordance with an embodiment of the present invention, a pick-up head comprises a shank comprising a holder and an intermediate body connected to the holder by a first joint. The pick-up head further comprises a collet head connected to the intermediate body by a second joint.

In accordance with an embodiment of the present invention, a collet head comprises a front surface configured to pick up dies, a connection body, a back surface with a cavity, the cavity configured to form a ball joint and a channel connecting the front surface and the cavity, the channel configured to be part of a vacuum path.

In accordance with an embodiment of the present invention, a method for adjusting an adjustable pick-up head comprises loosening a set screw of an adjustable pick-up head body, assembling an adjustable pick-up head by attaching a collet head to the adjustable pick-up head body and tightening the set screw thereby controlling the adjustability of the adjustable pick-up head.

In accordance with an embodiment of the present invention, a method for manufacturing a device comprises picking-up a die with an adjustable pick-up head and placing the die on a die carrier. The method further comprises bonding the die to the die carrier and encapsulating the die and the die carrier.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3a-3c shows an embodiment of the adjustable pick-up head with tilted or non-tilted collet head;

FIGS. 5a-5d shows embodiment of different stages of the method to adjust the adjustable pick-up head;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a die pick-up head for a die bonding tool. Embodiments of the invention may also be applied, however, to other pick-up heads such as a component or electronic device pick-up heads.

Figure 1:
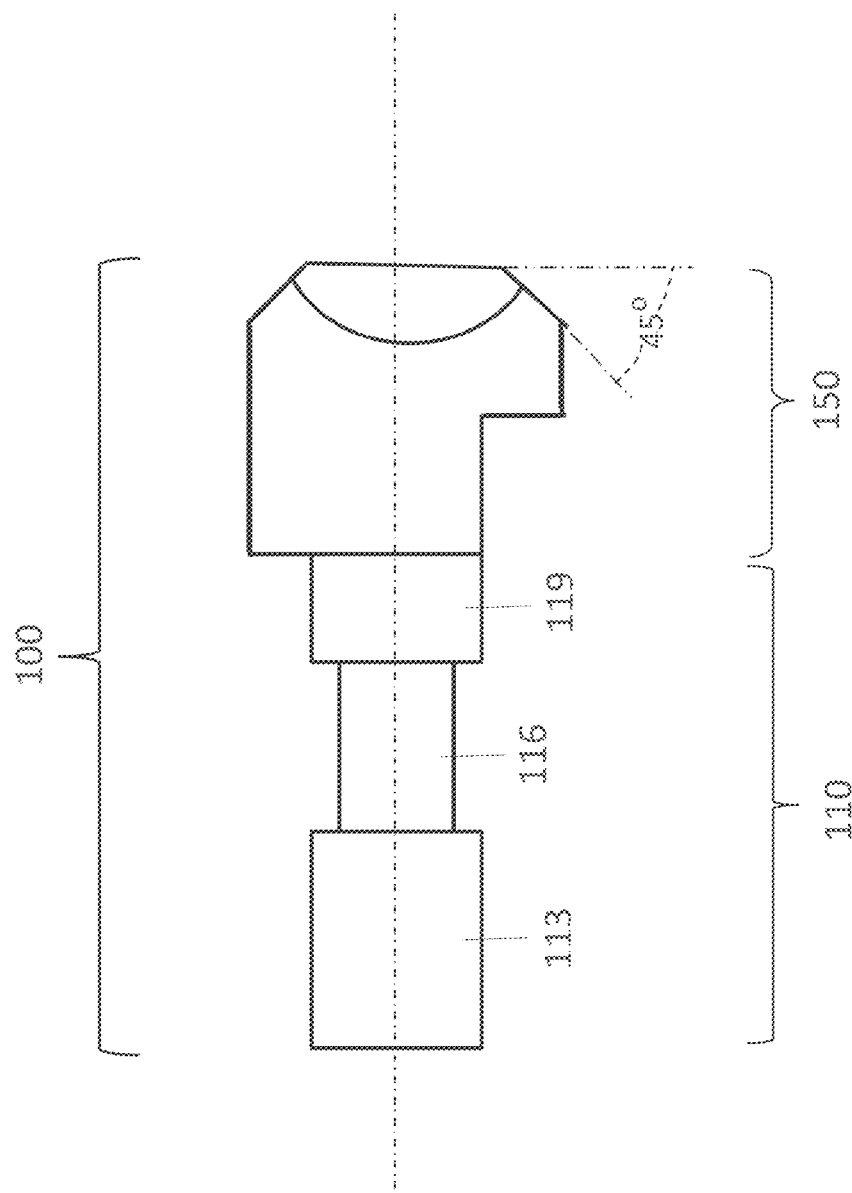
FIG. 1 illustrates the simplified cross-sectional view of a conventional pick-up head.

A simplified cross-sectional view of an exemplary conventional pick-up head is shown in FIG. 1: The pick-up head 100 comprises a shaft 110 and a collet head 150. The shaft 110 comprises cylinder-shaped sub-portions 113, 116, 119 designed to enable mounting of the shaft to a bonding tool (not shown) which provides the controlled movement of the pick-up head 100 in x-, y- and z-directions in order to position and align the chip to a bonding site of a leadframe. The shaft 110 and the collet head 150 may be two separate metal pieces connected together or one integrated single metal piece.

A problem with the conventional pick-up head is that voids may be formed between the die and the die carrier. The voids may occur as the result of air trapped within the bonding layer or as a "blow off" of bonding material at the edges of the die due to air released from farther inside regions of the bonding layer. Moreover, the voids may occur because of a non-uniform distribution of the bonding material over the bonding area or a non-uniform downward pressure of the pick-up head. The issues of void formation and non-uniformity of the bonding layer become more critical with increased die size.

The voids may negatively influence device performance in different ways: For example, the voids may lead to a less than optimal heat conductance from the die to the die carrier, thereby compromising effective heat removal during device operation. In other cases, the voids may cause an increase in contact resistance. If the bonding interface between die and die carrier is part of the current path of a device, increased resistance due to an imperfect bonding interface will increase power consumption. Finally, voids may also have a detrimental impact on the mechanical stability of the combined die/carrier system.

Embodiments of the present invention provide an adjustable pick-up and a bonding tool with an adjustable pick-up head. Embodiments of the present invention provide an adjustable pick-up head wherein the adjustable pick-up head comprises a first joint and a second joint.

Embodiments for the present invention further provide a method for manufacturing a semiconductor device applying the adjustable pick-up head. For example, a die may be bonded to a die carrier by diffusion soldering or adhesive bonding. The utilization of the disclosed method does not suffer from restrictions in chip size or package type.

Figure 2A:
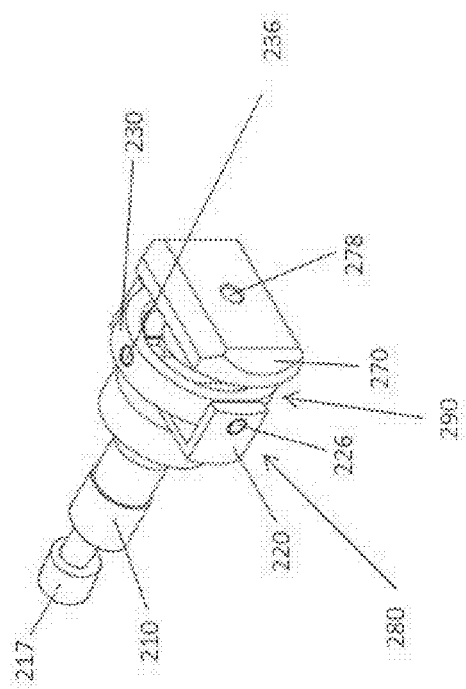
FIGS. 2a and 2b show a projection view and an exploded view of an embodiment of an adjustable pick-up head.
Figure 2B:
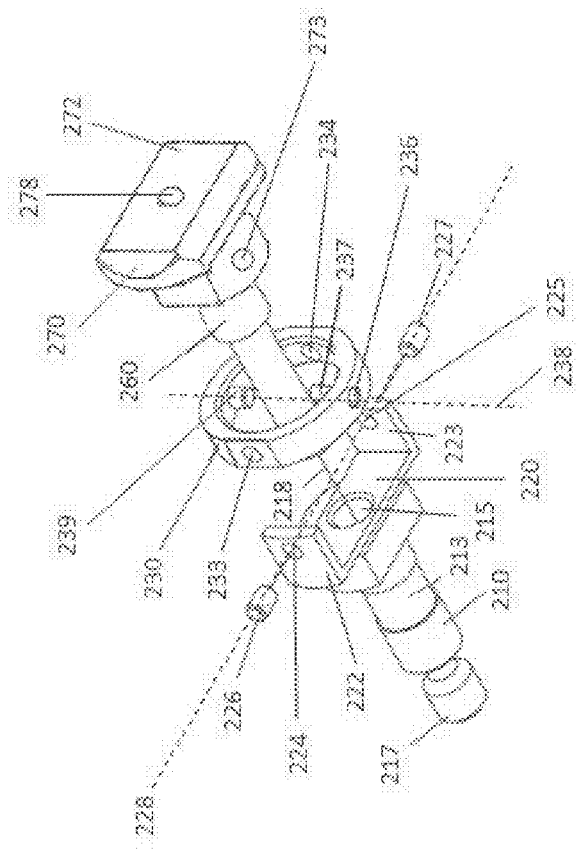
Figure 2D:
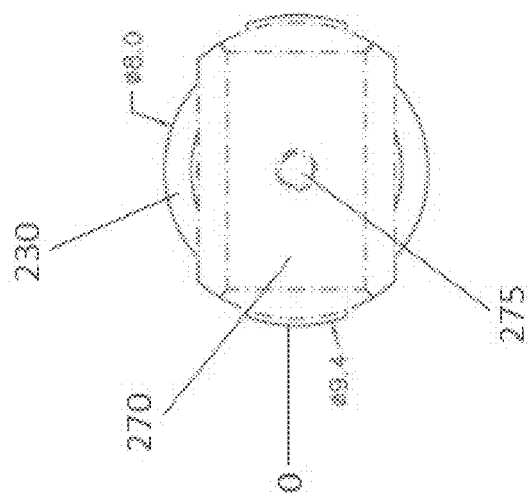
FIGS. 2c and 2d show a top view and a cross-sectional view of an embodiment of an adjustable pick-up head.
Figure 2C:
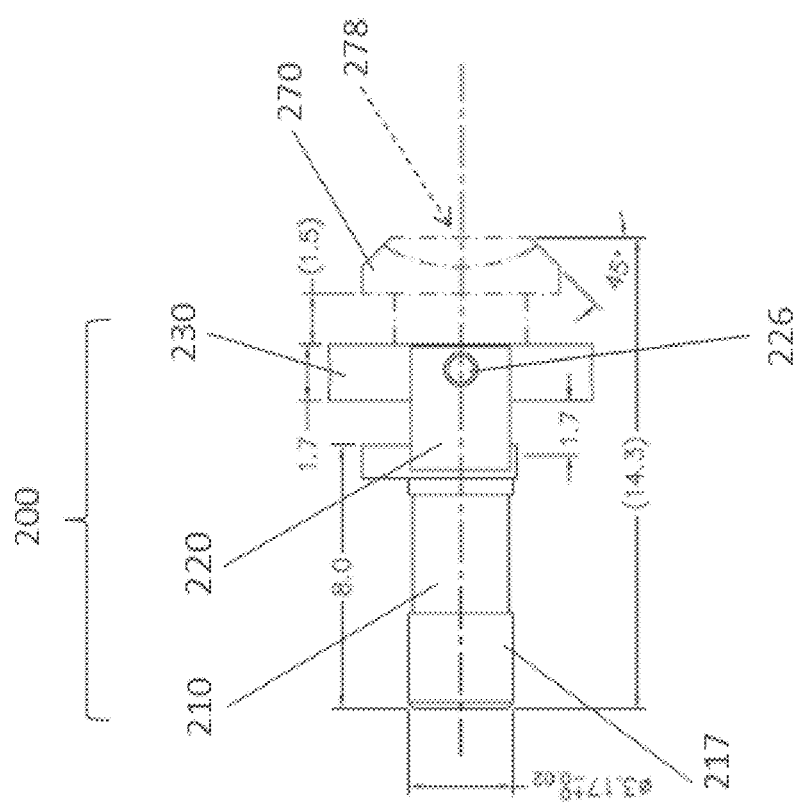

FIGS. 2a-2d show embodiments of an adjustable pick-up head 200. FIG. 2a shows a perspective view of the adjustable pick-up head 200, FIG. 2b shows an explosion view of the adjustable pick-up head 200, FIG. 2c shows a side view of the adjustable pick-up head 200 and FIG. 2d shows a front view of the adjustable pick-up head 200.

The adjustable pick-up head 200 of FIGS. 2a and 2c comprise a shank 210, a guide holder 220, an intermediate body 230 and a collet head 270. The shank 210 may be cylindrical and its diameter may vary over its length. A first end portion 217 is configured to be received by a bonding tool. The first end portion 217 may be a set screw.

The adjustable pick-up head 200 comprises a first joint 280 formed by a holder 220 and the intermediate body 230. The first joint 280 may be a first hinge. The holder or guide holder 220 may be a ring holder. The intermediate body 230 may be a guide ring 230. In one embodiment the guide ring 230 may be rotatable around the pivot point 226 of the guide holder 220.

The adjustable pick-up head 200 further comprises a second joint 290 formed by the intermediate body 230 and the collet head 270. The second joint 290 may be a second hinge. The second joint 290 may further comprise a rotatable ball joint or a rotatable ball and socket joint between a swivel body (hidden in FIGS. 2a and 2c) and the collet head 270. In one embodiment the collet head 270 may be rotatable around the pivot point 236 of the guide ring 220.

The adjustable pick-up head 200 finally comprises a vacuum path through the entire length of the head 200. A first opening 278 of the vacuum path is disposed in the collet head 270. For example, the first opening 278 of the vacuum path is disposed in the middle of the collet head 270 (shown in FIG. 2d). A second opening of the vacuum path is disposed in the first end portion 217 of the shank 210 (cannot be seen in these Figures). The vacuum path of the adjustable pick-up head 200 runs through shank 210, the swivel body and the collet head 270. The vacuum path is hermetically sealed at the different connection points or joints. The vacuum path is configured to be connected to the vacuum path of the bonding tool.

The adjustable pick-up head 200 is adjustable or configured to be adjustable in a three dimensional manner.

The explosion view of FIG. 2b shows a more detailed view of FIG. 2a. FIG. 2b shows the separate pieces which when assembled form the adjustable pick-up head 200. The pick-up head 200 comprises the shank 210, the intermediate body or guide ring 230, the swivel body 260 and the collet head 270. The shank 210 is connected to the guide ring 230. The swivel body 260 is inserted into the axial shank boring of the shank 210, and connected via the first end portion (e.g., set screw) 217 to the shank 210. The swivel body 260 is connected to the collet head 270.

The shank 210 comprises the first end portion or set screw 217 and a second end portion 213. The second end portion 213 is fixed to the intermediate body holder 220. The intermediate body holder or guide ring holder 220 comprises two lateral portions or arms 222, 223. The guide ring holder 220 is configured to receive the guiding ring 230. The first lateral portion 222 comprises a first boring 224 and the second lateral portion 223 comprises a second boring 225. The two borings 224, 225 provide a first pivot point and a second pivot point. The two borings 224, 225 define a first axis 228.

The shank 210 comprises a shank opening 215 of an axial shank boring which is part of the vacuum path through the shank 210. The shank 210 may comprise a shank axis 218 defined parallel to the length of shank 210 or parallel to the axial shank boring. The shank 210 may comprise a metal such as stainless-steel.

The intermediate body 230 may be a guide ring or may have any other suitable geometrical form. The guide ring 230 may comprise a second set of two borings 233, 234 positioned at flattened portions of ring. The guide ring 230 may comprise a metal such as stainless-steel.

In the assembled state the guide ring 230 and the guide ring holder 220 form a first joint 280. The guide ring 230 and the guide ring holder 220 are rotationally movable relative to each other around the first axis 228 and connected via the holding pins 226, 227. The first axis 228 may be perpendicular to a shank axis 218. A first holding pin 226 connects the boring 224 with the boring 234 and the second holding pin 227 connects the boring 225 with the boring 234.

Figures 2E, 2F:
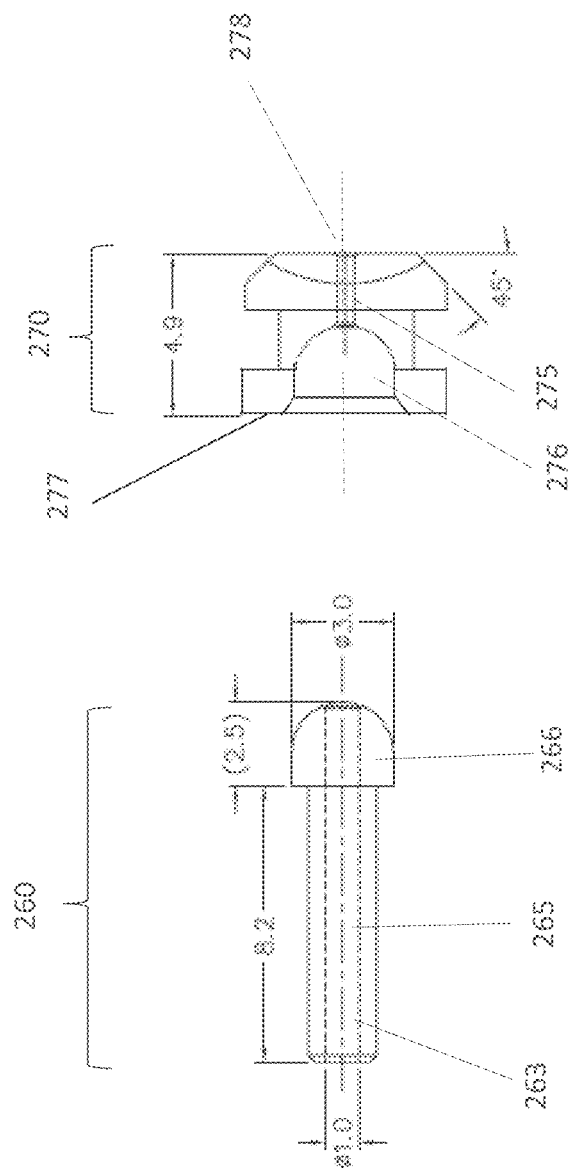
FIG. 2e illustrates a cross-section view of an embodiment of a swivel body.
FIG. 2f illustrates a cross-sectional view of an embodiment of a collet head.

The swivel body 260 is shown in FIG. 2e. The swivel body 260 comprises a swivel pin 263 and a swivel tip 266. The swivel body 260 may further comprise an axial swivel boring 265 which is part of the vacuum path. The swivel body 260 may comprise a hollow cylinder. The swivel tip 266 comprises a curved surface. For example, the swivel tip 266 may comprise a hemispherical surface.

The collet head 270 is shown in FIG. 2f. The collet head 270 comprises a contact surface 272 on a first side and a cavity 276 on a second side 277, wherein the second side 277 is opposite of the first side 272. The cavity 276 may be a curved cavity or a cup-shaped cavity. The cavity 276 is configured to receive the swivel tip 266 of the swivel body 260. The collet head 270 further comprises an axial boring 275 which connects to the opening or orifice 278. The axial boring 275 may comprise the form of a cylinder. The axial boring 275 is part of the vacuum path, vacuum conduit or vacuum channel and the opening or orifice 278 is one end of the vacuum path.

The material of the collet head 270 may comprise teflon, delrin, vespel (e.g., a polyimide-type polymer/graphite composite), or tungsten carbide. In one embodiment the collet head 270 may withstand a maximum operation temperature of up to 180° C., or alternatively, up to 500° C. For example, the maximum temperature for teflon is about 260° C., the maximum temperature for vespel is about 250° C., the maximum temperature for delrin is about 135° C. and the maximum temperature for tungsten carbide is about 500° C.

The first side 272 of the collet head 270 may be a square planar front surface. Alternatively, the collet head 270 may comprise a pyramid structure with four lateral side faces slanted towards the outside. Such an architecture allows to pick up the die by the edges rather than over a planar surface.

In an assembled state a second joint 290 comprises the cavity 276 of the collet head 270 and the swivel tip 266 of the swivel body 260. Moreover, the second joint further comprises an adjustable connection between the collet head 270 and the intermediate body or guide ring 230. The collet head 270 is adjustably rotatable around second rotational axis 238. The adjustable connection of the collet head 270 to the guide ring 230 is achieved via two collet head holding pins 237, 239. The two collet head holding pins 237, 239 are inserted through a third set of two borings 236 disposed on the guide ring 230. The two borings 236 define the second rotational axis 238. The two holding pins 237, 239 connect the guide ring 230 to the collet head 270 through the two borings 273 positioned at opposing side portions of the collet head 270.

This arrangement enables a rotational movement of the collet head 270 along the second axis 238. The second rotational axis 238 is perpendicular to the direction of the shaft axis 218. Since the positions of the second set of borings 233, 234 on the guide ring 230 are set off by 90° versus the positions of the third set of borings 236, the direction of the first rotational axis 228 is orthogonal to that of the second rotational axis 238. This ensures the capability for independent tilting movements of the collet head 270 in both x- and y-directions.

The second joint 290 also allows tilting of the collet head 270 versus the swivel body 260. In particular, the axial boring 265 of the swivel body can be tilted against the axial boring 275 of the collet head 270. The second joint 290 may be ball joint, or a ball socket.

In one embodiment the maximum tilting angle of the collet head 270 relative to the swivel body 260 is about 45° in x- and y-directions. Alternatively, the maximum tilting angle of the collet head 270 relative to the swivel body is about 25°. Examples of the collet head 270 in non-tilted and tilted positions are shown in FIGS. 3a-3c. For example, the collet head 270 is not tilted in FIG. 3a, tilted in an x-direction in FIG. 3b and tilted in y-direction in FIG. 3c.

In an assemble state the pick-up head 200 comprises a vacuum path or vacuum channel composed of the axial shank boring (with the shank opening 215), the axial swivel borings 265 of the swivel body 260 and the axial boring of the collet head 275. This vacuum channel is connected to a vacuum pump in the bonding tool. The vacuum pump is configured to provide the under-pressure, the vacuum or the suction for picking-up the dies.

Figure 4:
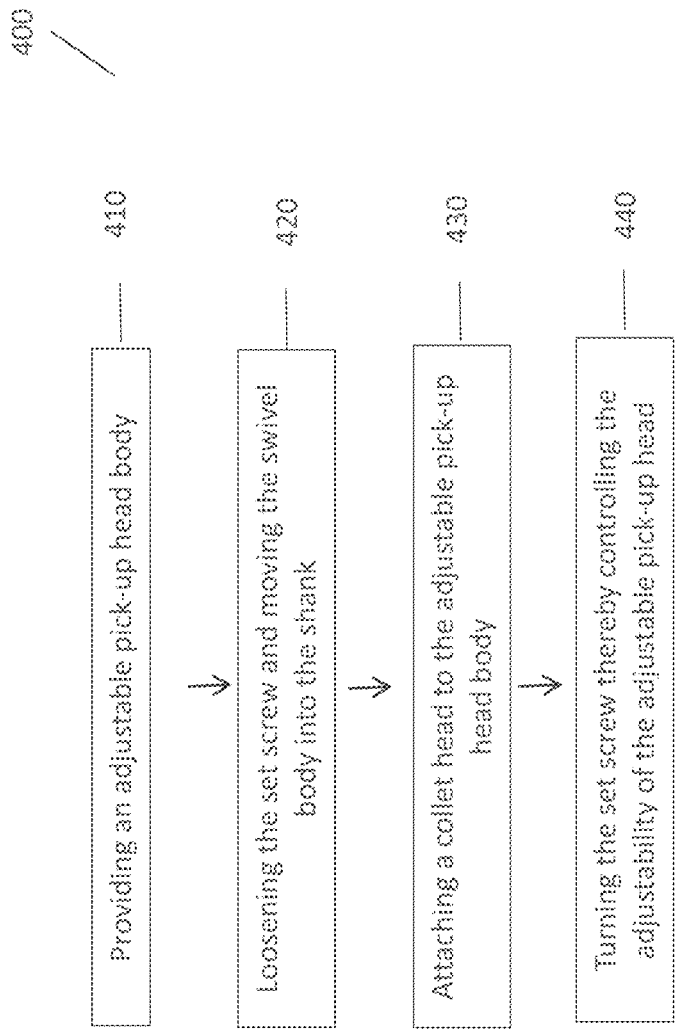
FIG. 4 shows an embodiment of a method to adjust an adjustable pick-up head.

FIG. 4 shows a flow chart 400 of an embodiment of a method to adjust the adjustable pick-up head. In step 410 a adjustable pick-up head body is provided. An adjustable pick-up head body is shown in FIG. 5a. The adjustable pick up head body 500 comprises a shank 510 including a set screw 517, an intermediate body holder 520, an intermediate body 530, and a swivel body (not shown). The adjustable pick-up head body 500 may comprise the same elements as described with respect to the embodiments of FIGS. 2a-2f.

In step 420 the set screw on one end of the shank is loosened such that the swivel body is moved into the shank boring through a shank opening. The shank opening is disposed on an opposite end of the shank with respect to the set screw. In one embodiment, the set screw is turned anticlockwise so that the swivel body moves into the shank. Alternatively, the set screw is turned clockwise so that the swivel body moves into the shank. In one embodiment, by turning the set screw the swivel pin moves into the shank through the shank opening of the shank until the swivel tip reaching the shank opening. This is shown in FIG. 5a.

Figure 7:
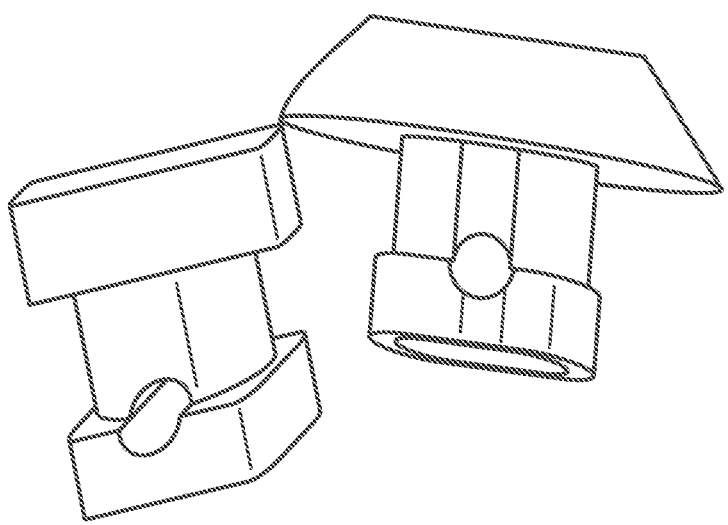
FIG. 7 shows embodiments of collet heads.

In step 430 the collet head is attached to the adjustable pick-up head body. The collet head is inserted into and attached to the adjustable pick-up head body. The collet head is inserted into the intermediate body. Embodiments of the collet head are shown in FIG. 7. In one embodiment the collet head is turned such that collet borings disposed on side surfaces of the collet head are aligned with intermediate body borings. The collet head borings and the intermediate body borings are connected via collet head holders (e.g., pins). For example, the collet head is turned until the collet head borings are positioned opposite the guide ring borings. Then collet head holding pins are inserted into guide ring borings and the collet head borings. At the same time the swivel tip or swivel head of the swivel body moves into the cavity of the collet head. This is shown in FIG. 5b.

Figure 5C:
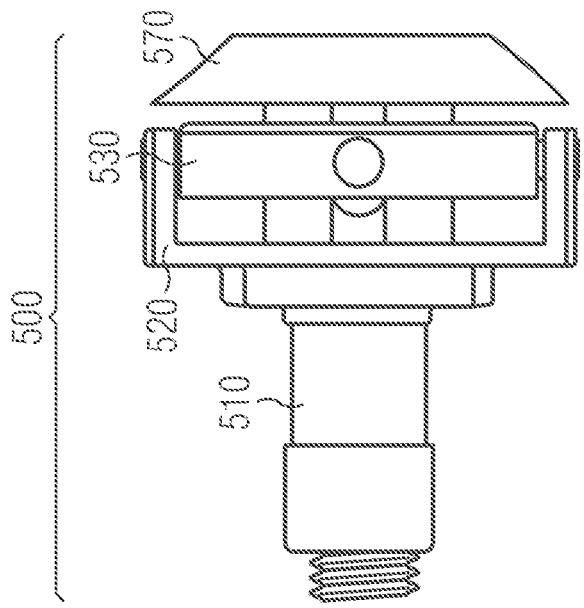
Figure 5D:
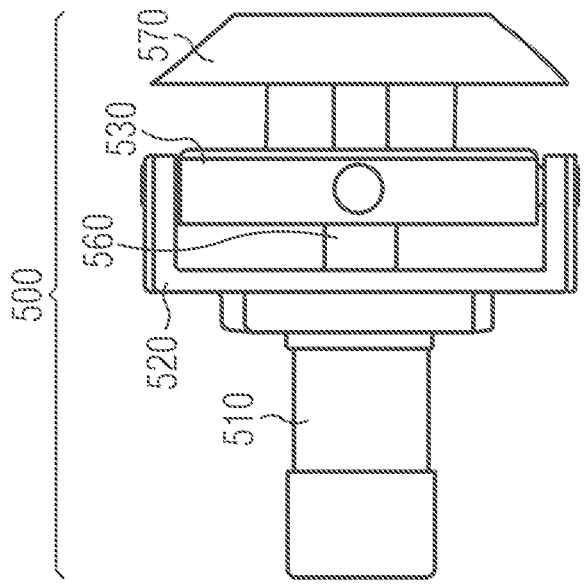

In step 440, the set screw is tightened such that the adjustability of the pick-up head is adjusted or controlled. The adjustability of the adjustable pick-up head can be controlled by regulating, adjusting or fine-tuning the set screw. The adjustment of the set screw controls the extent of the lateral movement of the swivel pin in the shank boring. In one embodiment the set screw is turned clockwise to move out the swivel pin. Alternatively, the set screw is turned anticlockwise. In this adjustment the swivel body moves the collet head by moving the swivel tip and collet cavity. The amount of a turn or the number of turns of the set screw may determine the degree of pick-up head or collet head adjustability. Less turning makes the collet head looser and more turning makes the collet head more rigid. FIG. 5c shows the adjustable pick-up head before the set screw is adjusted (e.g., tightened) and FIG. 5d shows the adjustable pick-up head after the set screw is adjusted. As can be seen from FIG. 5d relative to FIG. 5c, the pin is moved out, and swivel tip and the cavity in the collet head fit tighter together.

Figure 6:
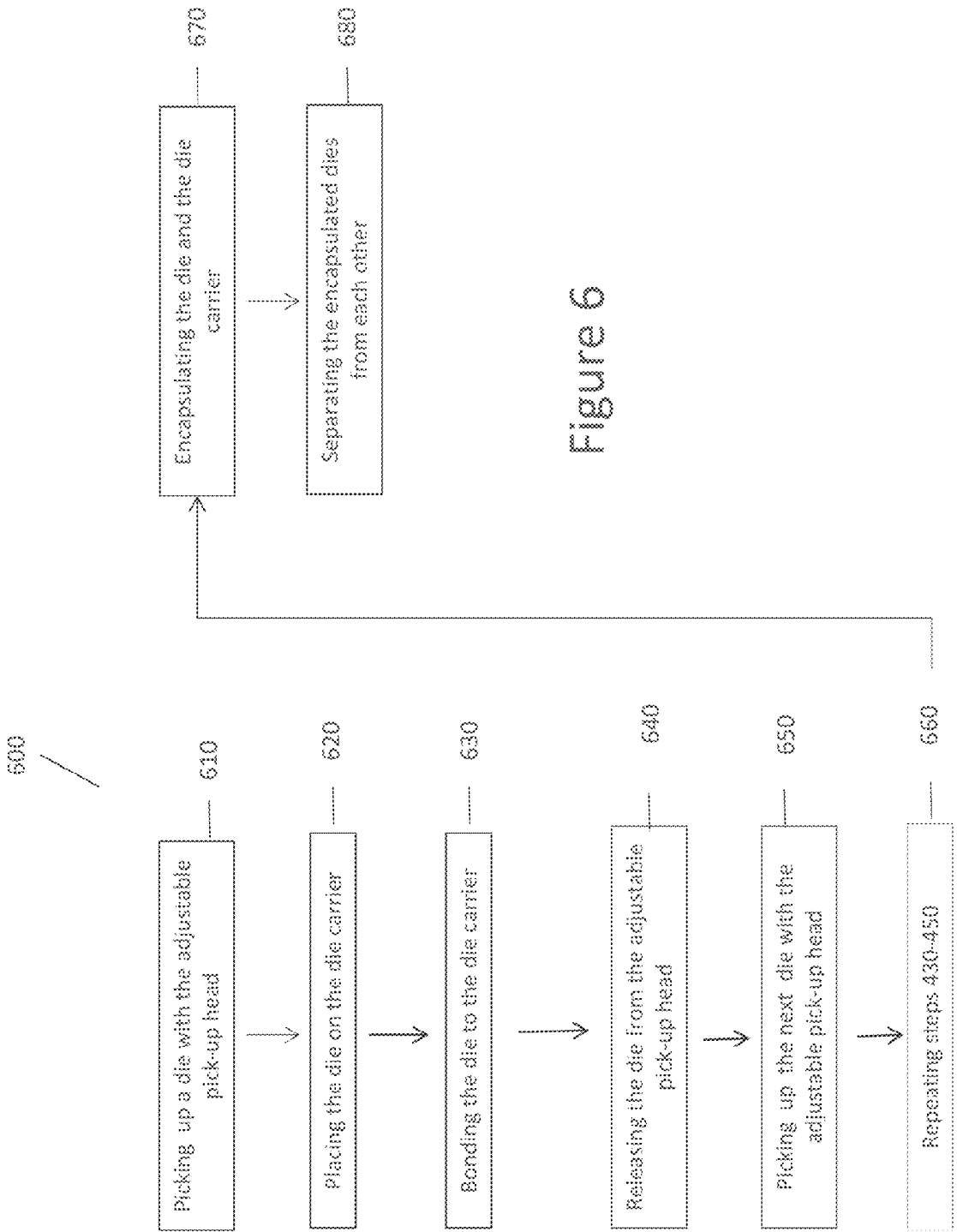
FIG. 6 shows a method for manufacturing a device using the adjustable pick-up head.

FIG. 6 shows a flow chart 600 of an embodiment of method of manufacturing a semiconductor package.

In a first step 610, a die or chip is picked up from a dicing foil, a shuttle conveyer or another surface. The die or component may comprise a discrete device such as a single semiconductor device or an integrated circuit (IC). For example, the die may comprise a semiconductor device such as a MOSFET or a power semiconductor device such as a bipolar transistor, an insulated gate bipolar transistor (IGBT), or a power MOSFET. Alternatively, the die may comprise a thyristor or a diode. Moreover, the die may be a resistor, a protective device, a capacitor, a sensor or a detector, for example. In some embodiments the die may be a system on chip (SoC).

In one embodiment the die comprises a single transistor having a top surface comprising a source and/or a gate, and a bottom surface comprising a drain. Alternatively, the top surface comprises a drain and/or a gate and the bottom surface comprises a source.

In one embodiment the die comprises a substrate such as a semiconductor substrate. The semiconductor substrate may be silicon or germanium, or a compound substrate such as SiGe, GaAs, InP, GaN or SiC, or alternatively, other materials. The substrate may be doped or undoped and may comprise one or more wells.

In one embodiment the die comprises a metal layer on its bottom surface. The metal layer is configured to be soldered to a die carrier. The metal layer may comprise barrier layers of Cr, V, or Ti upon which thin layers (0.1-10 µm) of Au (or Ag) and Ni are formed. The latter metal layers may ensure good wettability for soldering and for forming of strong metallurgical bonds (e.g. of Ni—Sn bonds).

The die is picked up with a bonding tool comprising the adjustable pick up head according to embodiments of the invention. For example, the die is picked up by placing the collet head on or over the die. The die is picked up with the adjustable pick-up head by applying vacuum suction through the vacuum path of the pick-up head.

In step 620 the die is placed on a die carrier. For example, the die is aligned with high accuracy over its assigned bonding site on the die carrier. The die carrier may be a substrate, a leadframe or a printed circuit board (PCB). In one embodiment the die carrier is a metal lead frame comprising copper and nickel. The leadframe may further comprise gold (Au) disposed on the nickel (Ni).

The leadframe may comprise a die attach film. In one embodiment the die attach film may be a non-conductive adhesive such as a thin organic film comprising epoxy, polyimide or cyano ester compounds. The non-conductive adhesive may be applied to the leadframe by screen printing or stencil printing. Alternatively, the non-conductive adhesive is a foil. In another embodiment die attach film may be a conductive film. The conductive die attach film may comprise a base polymer of similar chemical nature as those of non-conductive adhesive films, and a 70-80% metal loading of highly conductive flakes of Ag, Ag-coated Cu, Ni or Au.

Alternatively, a solder material may be disposed. A solder material may comprise AuSn, AgSn, CuSn, CuAuSn, PtIn, PdIn.

In one embodiment diffusion bonding is applied at a temperature between about 150° C. to about 250° C.

In step 630 the die is bonded to the die carrier. In one embodiment the die is bonded to the die carrier applying diffusion bonding. In preparation for die bonding the bonding site on the die carrier is brought up to a temperature of about 220° C. to about 400° C. For example, the substance may pass through an indexer tunnel of a hot die attach machine. The carrier may pass through an indexer tunnel comprising several (e.g. 8) heating zones thereby gradually increasing the bonding temperature (e.g. 360° C.), stabilizing the bonding temperature, and cooling down the temperature after die bonding. In order to prevent oxidation of the solder or metallization films the indexer tunnel may be filled with reducing forming gas atmosphere.

The actual die-to-substrate bonding is carried out by lowering the collet head to bring the die in physical contact to the die carrier. This downward movement of the collet head is slowed down over a period of approximately 300 ms (so-called bond soften delay) to allow preheating of the die backside of the die prior to bonding. After the end of the bond soften delay a slight further downward movement of the collet head occurs while applying controlled pressure provided by a pneumatic system of the bonding tool. The bonding force to be applied depends on the chip size. Typical bonding force values for diffusion soldering are in the range of 50-100 N. Alternatively about 3 N/mm² die size may be applied.

For bonding the die to the die carrier with an adhesive layers the applied bonding force can be significantly lower. For example, the applied bonding time, i.e. the time from the first die contact with the substrate to the release of the collet head from the die, ranges generally from 200-400 ms.

In step 640, the adjustable pick-up head including the collet head is released from the die. For example, the vacuum is turned off and the collet head is moved up.

In step 650, the adjustable pick-up head picks up the next die and in step 660 the bonding tool repeats steps 620-650. The next die may undergo the same alignment and bonding procedures as the first die. Step 650 and 660 may be optional step since in some embodiments only one die is bonded to one die carrier.

After the contacts of the die(s) are connected via connection elements (wire bonds or metal clips) to the die carrier 670 the die(s) and the die carrier are encapsulated. The encapsulation material may be a molding compound, a laminate or a casing. The die(s) and the connection elements may be completely encapsulated, and the die carrier may be partially encapsulated. Alternatively, the die(s) may be completely encapsulated and at least one of the connection elements may be partially encapsulated.

In an optional step 680, the packaged or encapsulated dies may be singulated from each other by a cutting laser or cutting saw such that a packaged chip or die is manufactured.

The adjustability of the collet head provides an optimal contact between the bonding interface of an individual die and the surface of the corresponding bonding site on the die carrier. An advantage of using the adjustable pick-up head is avoidance or the reduction of void formation. In particular, the adjustable pick-up head may work well for die sizes exceeding 10 mm².

In one embodiment the pick-up head may work for any bonding application, irrespective of the nature of the bonding material. For example, the adjustable pick-up head may be applied for bonding non-conductive adhesive wafer backside coatings, conductive adhesive backside coatings, solder materials or any type of diffusion solder material.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A pick-up head comprising:
   a shank comprising a holder, the holder having arms;
   an intermediate body;
   a first joint formed by the intermediate body and the arms, wherein the intermediate body is configured to be pivotable relative to the shank around a first axis, and wherein the first axis is defined as orthogonal to opposite facing inner surfaces of the arms; and
   a collet head connected to the intermediate body by a second joint.

2. The pick-up head according to claim 1, wherein the holder comprises a first boring in an arm, wherein the intermediate body comprises a second boring, wherein the first joint further comprises a holding pin, and wherein the holding pin is disposed in the first boring and the second boring.

3. The pick-up head according to claim 1, wherein the second joint comprises the collet head configured to be pivotable around a second axis in the intermediate body, the second axis being different than the first axis.

4. The pick-up head according to claim 3, wherein the second axis is orthogonal to the first axis.

5. The pick-up head according to claim 1, wherein the second joint further comprises a ball joint between a swivel body and the collet head.

6. The pick-up head according to claim 1, wherein the collet head comprises vespel, teflon, delrin or a high temperature rubber.

7. The pick-up head according to claim 1, wherein the shank, the intermediate body and a swivel body comprise stainless-steel.

8. A pick-up head comprising:
   a shank comprising a holder;
   an intermediate body connected to the holder by a first joint;
   a collet head connected to the intermediate body by a second joint; and
   a set screw configured to adjust an adjustability of the pick-up head.

9. The pick-up head according to claim 8, wherein the first joint is formed by the intermediate body and arms of the holder, and wherein intermediate body is configured to be pivotable around a first axis orthogonal to the arms.

10. The pick-up head according to claim 9, wherein the holder comprises a guide ring holder boring in an arm, wherein the intermediate body is a guide ring with a guide ring boring, wherein the first joint further comprises a holding pin, and wherein the holding pin is disposed in the guide ring holder boring and the guide ring boring.

11. The pick-up head according to claim 8, wherein the second joint comprises the collet head configured to be pivotable around a second axis in the intermediate body, the second axis being different than a first axis.

12. The pick-up head according to claim 11, wherein the second axis is orthogonal to the first axis.

13. The pick-up head according to claim 8, wherein the second joint further comprises a ball joint between a swivel body and the collet head.

14. The pick-up head according to claim 8, wherein the collet head comprises vespel, teflon, delrin or a high temperature rubber.

15. The pick-up head according to claim 8, wherein the shank, the intermediate body and a swivel body comprise stainless-steel.

16. A pick-up head comprising:
a shank comprising a guide ring holder;
a first pivotable joint formed by a guide ring and the guide ring holder, the first pivotable joint being pivotable around a first axis orthogonal to a shank axis;
a collet head; and
a second pivotable joint formed by the guide ring and the collet head, the second pivotable joint being pivotable around a second axis orthogonal to the shank axis.

17. The pick-up head according to claim 16, further comprising a swivel body establishing a vacuum path between the shank and the collet head.

* * * * *